United States Patent [19]

Tsuji et al.

[11] 4,156,963

[45] Jun. 5, 1979

[54] METHOD FOR MANUFACTURING A SEMICONDUCTOR DEVICE

[75] Inventors: Isamu Tsuji; Nobuo Itazu, both of Yokohama; Katsuhiko Takigami, Yamato, all of Japan

[73] Assignee: Tokyo Shibaura Electric Co., Ltd., Kawasaki, Japan

[21] Appl. No.: 863,445

[22] Filed: Dec. 22, 1977

[30] Foreign Application Priority Data

Dec. 28, 1976 [JP] Japan ................................ 51-157352

[51] Int. Cl.$^2$ ............................................. B01J 17/00
[52] U.S. Cl. ........................................ 29/581; 29/589; 29/590
[58] Field of Search .......................... 29/581, 589, 590

[56] References Cited

U.S. PATENT DOCUMENTS

| 3,991,461 | 11/1976 | Anderson | 29/588 |
| 4,040,085 | 8/1977 | Jouanny | 29/589 |
| 4,068,368 | 1/1978 | De Bard | 29/589 |

FOREIGN PATENT DOCUMENTS 1488860 10/1977 United Kingdom.

*Primary Examiner*—W. Tupman
*Attorney, Agent, or Firm*—Oblon, Fisher, Spivak, McClelland & Maier

[57] ABSTRACT

A method for manufacturing a semiconductor device having a cathode layer divided into a plurality of mesa type cathode layer portions and used under pressure applied from the cathode layer side through a pressing plate, the method comprising steps of disposing a flat plate having a lateral width covering at least from the outer edge of a cathode electrode disposed on one outermost cathode layer portion to the outer edge of a cathode electrode disposed on the other outermost cathode layer portion, applying an external pressure through the flat plate, and then disposing the pressing plate.

5 Claims, 12 Drawing Figures

METHOD FOR MANUFACTURING A SEMICONDUCTOR DEVICE

BACKGROUND OF THE INVENTION

This invention relates to a method for manufacturing a mesa type semiconductor device used under pressure applied from the cathode side, i.e., in the pressure-applied manner.

Heretofore, there have been widely known and used pressure-applied type semiconductor devices which are used under pressure applied from the cathode side. As an example of such pressure-applied type semiconductor devices, FIG. 1 shows a pressure-applied type gate turn off thyristor device (hereinafter referred to as GTO). In FIG. 1, the GTO element is formed of a semiconductor body including an anode P layer 12, an intermediate N layer 14, a gate P layer 16, and a cathode N layer 18. The cathode layer 18 is divided into a plurality of mesa type portions 18a, 18b, 18c and 18d. The anode layer 12, gate layer 16, and cathode layer portions 18a, 18b, 18c and 18d are provided with an anode electrode 20, a gate electrode 22, and cathode electrodes 24a, 24b, 24c and 24d respectively. To the gate electrode 22 is attached a gate lead wire 25. Thus composed structure is supported by a supporting plate 26. An anode terminal plate 30 is attached to the supporting plate 26 by means of a solder 28. On the cathode electrodes 24a, 24b, 24c and 24d is disposed a pressing plate 32. The lateral width of the pressing plate 32 is smaller than a lateral width covering all the cathode electrodes 24a, 24b, 24c and 24d, that is, covering from the outer edge of one outermost cathode electrode 24a to the outer edge of the other outermost cathode electrode 24d. On the pressing plate 32 is disposed a cathode terminal plate 36. The lateral width of the pressing plate 32 is so prescribed as stated above for the following reason. That is, while the pressure-applied type semiconductor device is used under an external pressure applied from the cathode side, the cathode layer 18 subsides in such a manner as described later. Consequently, if the lateral width of the pressing plate 32 is large enough substantially to protrude outward from the cathode layer 18, the pressing plate 32 may come into contact with the gate lead wire 25 extending from the gate electrode 22, thereby causing short-circuit between the cathode and gate. The gate electrode 22 and cathode electrodes 24a to 24d are usually some 10 $\mu$mm thick and the distance between the surface of the gate layer 16 and the surface of the cathode layer 18 is approximately 20 $\mu$m, so that the distance between the under surface of the pressing plate 32 and the surface of the gate electrode 22 is approximately 20 $\mu$m.

The GTO device (semiconductor device) may be used under a pressure F applied from the outside in such a direction as indicated by arrows in FIG. 2. That is, the device is used in such a manner that the thermal resistance between the cathode electrodes 24a, 24b, 24c and 24d and the pressing plate 32 is reduced, and the heat produced at the GTO element is positively radiated through the pressing plate 32 to increase the current capacity.

Meanwhile, when the external pressure F is applied through the pressing plate 32 as indicated by arrows, the soft solder 28 at a portion corresponding to the pressing plate 32 is plastically transformed as shown in FIG. 2. Namely, the central portion becomes thinner as compared with the peripheral portion. While in this case a portion of the GTO element corresponding to the pressing plate 32 is also transformed or sunk downward by the external pressure F, the portions of the outermost cathode electrodes 24a and 24d in contact with the pressing plate 32 are subjected to the external pressure F. Those portions which is not in contact with the pressing plate 32, however, is not subjected to the external pressure because the cathode electrodes 24a and 24d are only partially in contact with the pressing plate 32.

Thus, the outermost cathode layer portions 18a and 18d are so deformed as shown in FIG. 2, thereby concentrating the external pressure F upon the outermost cathode electrodes 24a and 24d.

If the cathode layer portions 18a and 18d are thus deformed, then there will be caused the following defects. That is, (1) the effective area of the cathode electrodes 24a and 24d, i.e., the area of the cathode electrodes 24a and 24d which is in contact with the pressing plate 32 may be reduced, and the portions of the cathode electrodes 24a and 24d at the contact points may be raised in current density, thereby causing breakdown of the GTO element, and (2) the metal (usually aluminium) forming the cathode electrodes 24a and 24d may be forced out under the influence of the heat produced in use to hang down along the side walls of the cathode layer portions 18a and 18d, thereby causing short-circuit between the cathode electrodes 24a and 24d and the gate electrode 22 in prolonged use.

SUMMARY OF THE INVENTION

An object of this invention, devised in consideration of the above circumstances, is to provide a method for manufacturing a mesa type semiconductor device free from any deformation of cathode layer portions that could be caused by any external pressure applied between anode and cathode terminal plates.

According to the invention, there is provided a method for manufacturing a mesa type semiconductor device which is used under pressure applied between an anode terminal plate and a cathode terminal plate and which includes a semiconductor body having an outer layer divided into a plurality of outer portions, the method comprising steps of: preparing a semiconductor body having two outer layers one of which is divided into a plurality of outer layer portions, each of the outer layer portions being provided with a first electrode and the other layer being provided with a second electrode; providing a support plate for the resultant structure in such a manner that the second electrode comes in contact with one surface of the support plate; mounting a first terminal plate on the other surface of the support plate by means of solder means; disposing on the first electrodes a flat plate having a lateral width covering at least from the outer edge of one outermost first electrode to the outer edge of the other outermost first electrode; applying a pressure from outside on to the semiconductor body through the flat plate; removing the flat plate; disposing on the first electrodes a pressing plate having a lateral width smaller than a distance ranging from the outer edge of said one outermost first electrode to the outer edge of said other outermost first electrode; and disposing a second terminal plate on the pressing plate.

DETAILED DESCRIPTION OF THE PREFERRED EMBODIMENT

Referring now to FIGS. 3 to 11, there will be described the method for manufacturing the mesa type semiconductor device according to this invention, applying a GTO device by way of example.

Figure 1:
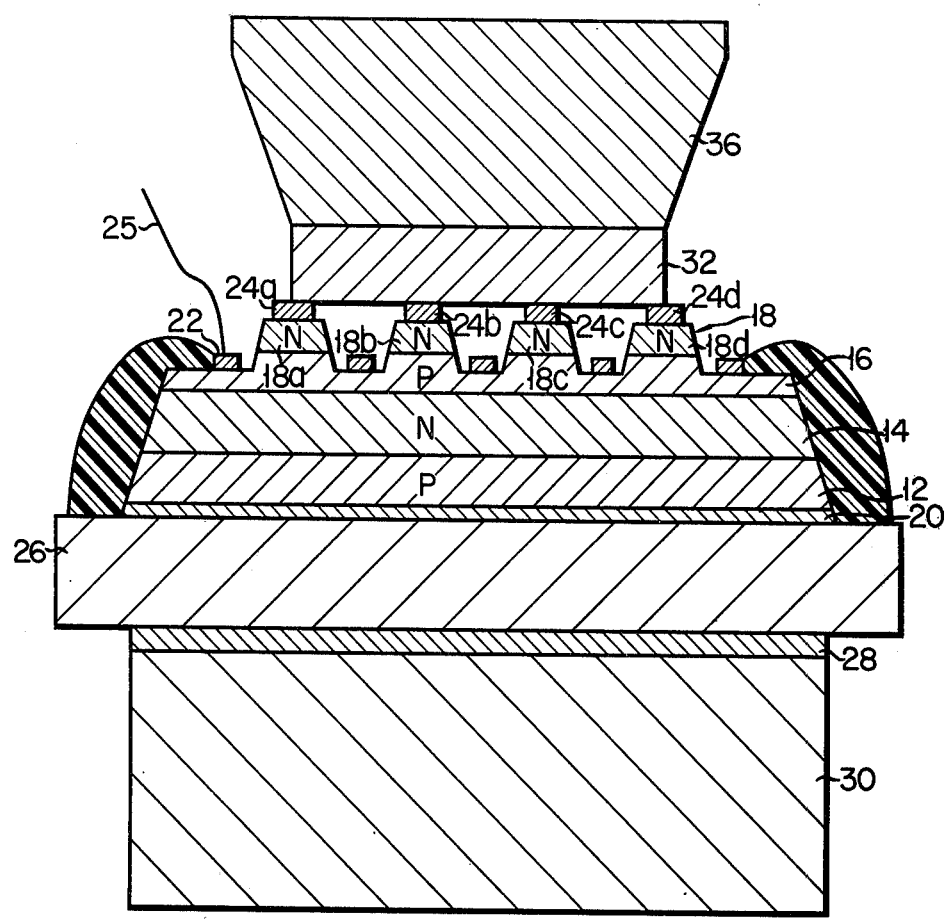
FIG. 1 is a sectional view of an example of the prior art pressure-applied type semiconductor device.
Figure 3:
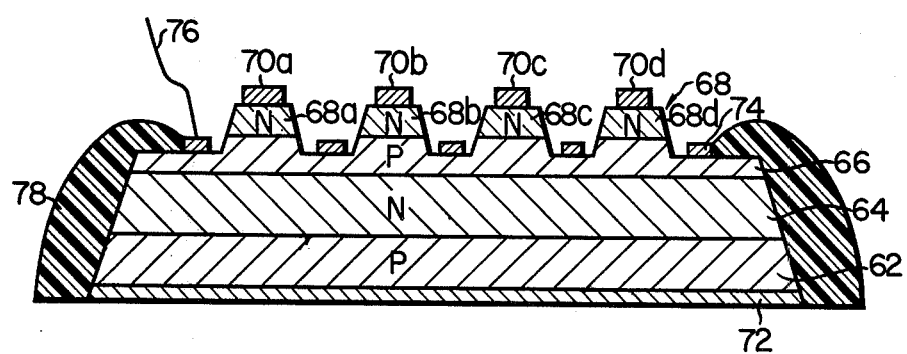
FIGS. 3, 4, 5, 6, 7, 10 and 11 are sectional views showing an embodiment of the manufacturing method according to this invention.
Figure 2:
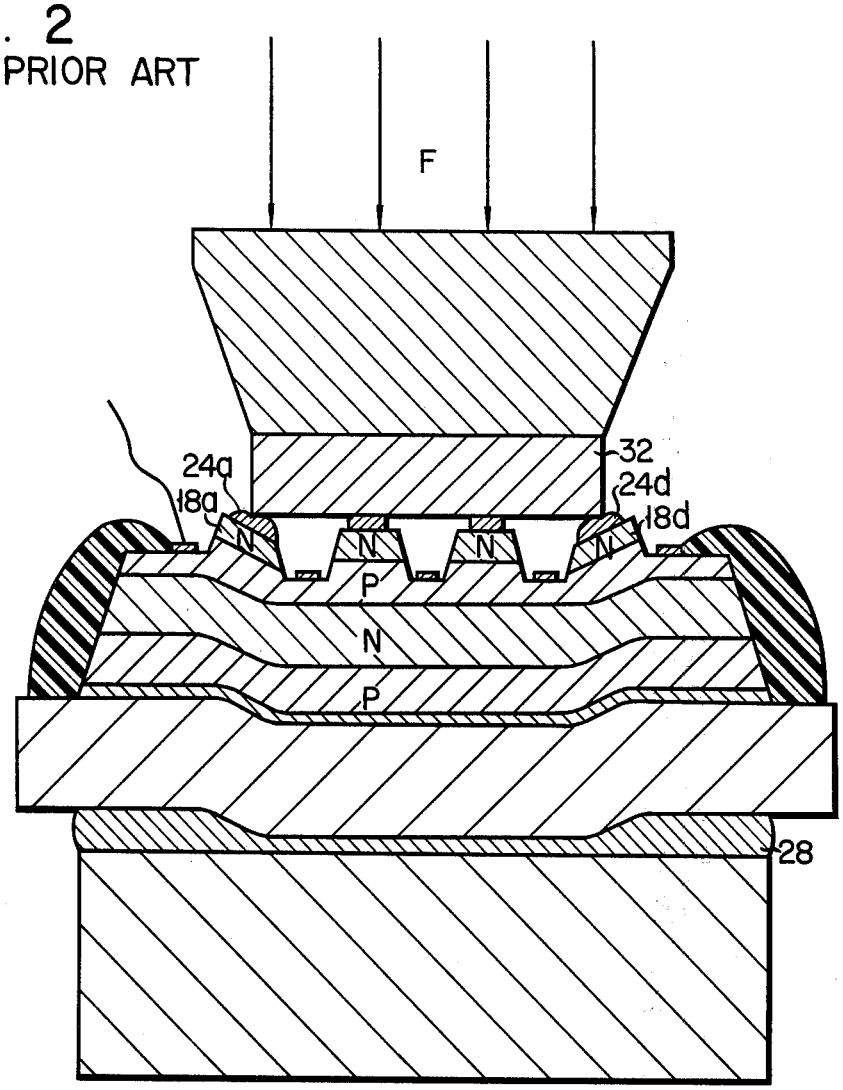
FIG. 2 is a sectional view of the device of FIG. 1 to which an external pressure is applied.

As shown in FIG. 3, there is first prepared a semiconductor body formed of four PNPN layers 62, 64, 66 and 68 by a well-known method, such as impurity diffusion method, epitaxial method, etc. The P layer 62, N layer 64, P layer 66 and N layer 68 are used as an anode layer, intermediate layer, gate layer and cathode layer, respectively. The cathode N layer 68 is divided into a plurality of mesa type portions 68a, 68b, 68c and 68d, which are provided with cathode electrodes 70a, 70b, 70c and 70d, made of e.g. aluminium, respectively. Likewise, the anode P layer 62 and gate P layer 66 are provided with an anode electrode 72 and a gate electrode 74, made of e.g. aluminium, respectively. The gate electrode 74 is attached by one end of a gate lead wire 76 by a known method such as high-frequency beam bonding. The side walls of the anode P layer 62, intermediate N layer 64 and gate P layer 66 are covered with a protective film such as Si rubber 78.

Figure 4:
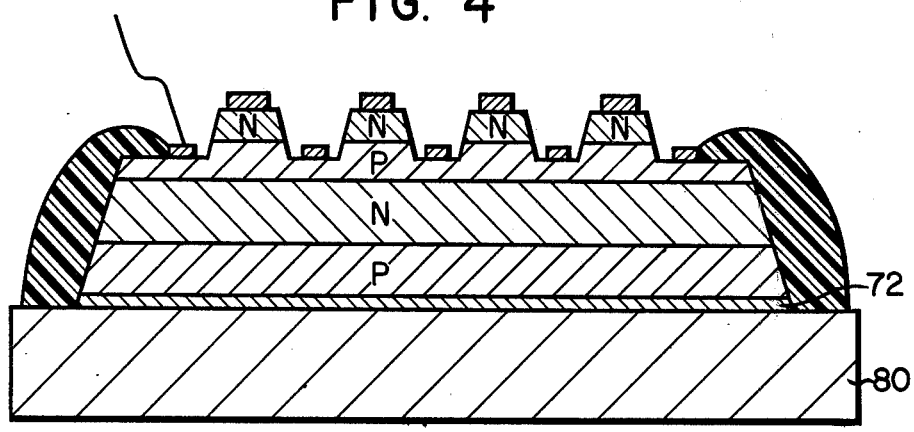

Such structure is disposed on a supporting plate 80 so that the anode electrode 72 is brought in contact with the supporting plate 80 as shown in FIG. 4.

Figure 5:
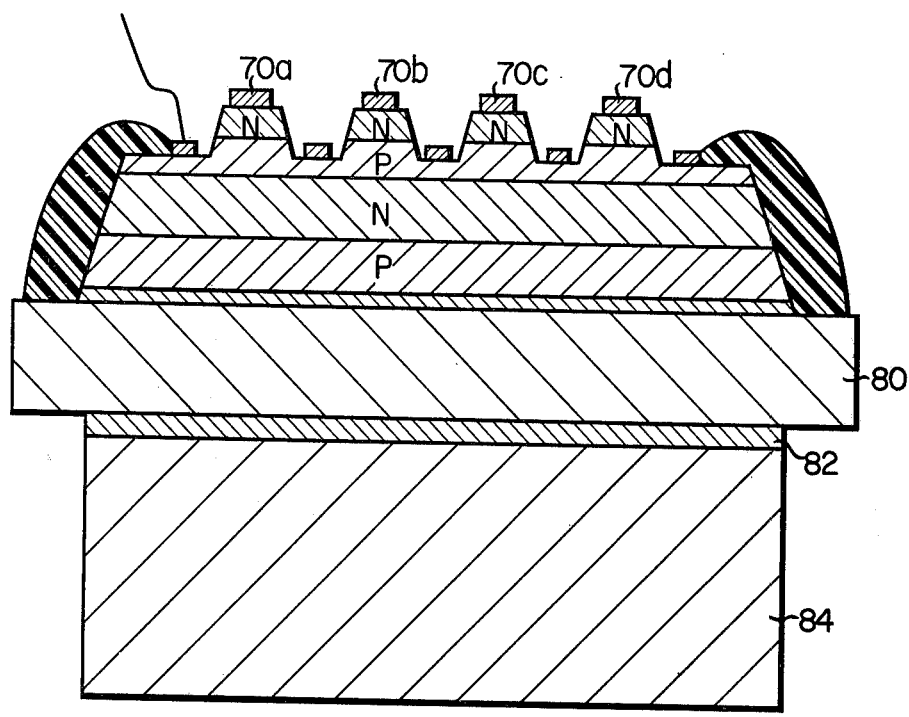

Subsequently, the supporting plate 80 is attached to an anode terminal plate 84 by means of, for example, a solder 82 as shown in FIG. 5. The anode terminal plate 84 is attached to an envelope (not shown).

Figure 6:
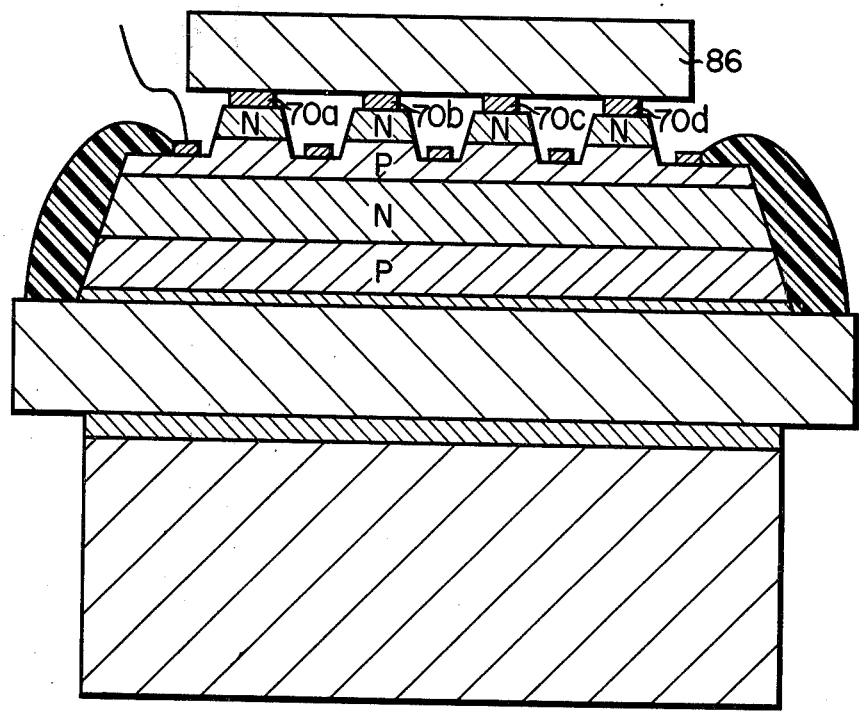

Thereafter, on the cathode electrodes 70a to 70d is disposed a flat plate 86 made of e.g. metal with a lateral width equal to or at least larger than a distance from the outer edge of one outermost cathode electrode 70a to the outer edge of the other outermost cathode electrode 70d. In FIG. 6 there is disposed a flat plate 86 having a lateral width larger than distance fully covering all the cathode electrodes 70a to 70d.

Figure 7:
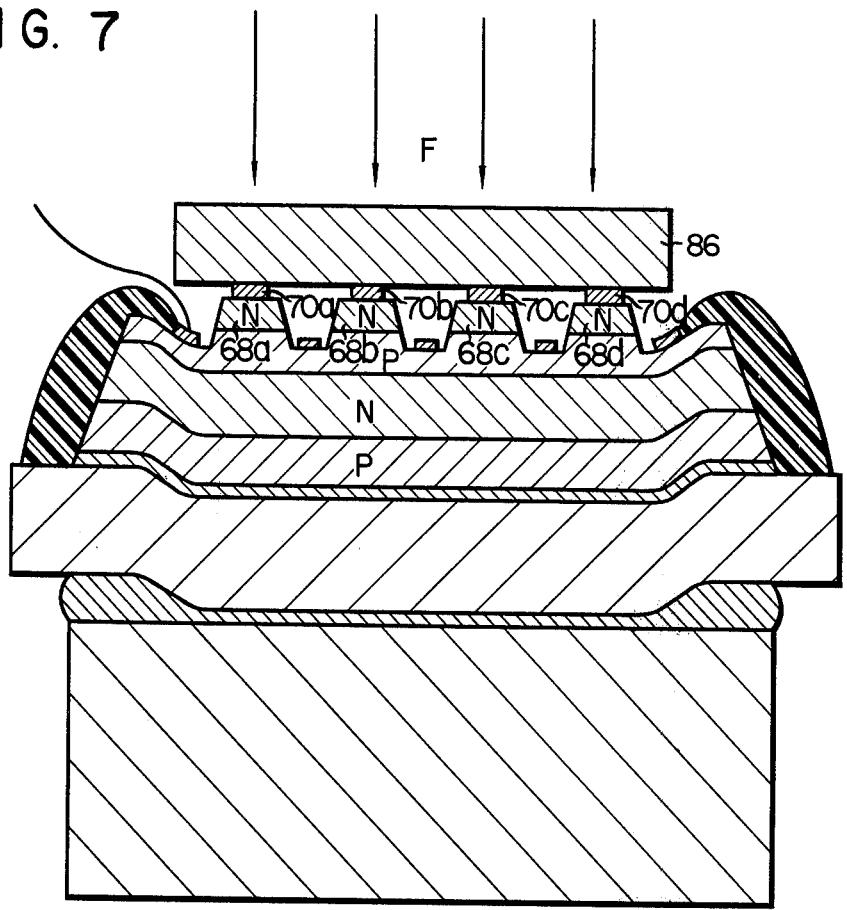

Then, as shown in FIG. 7, the structure is subjected to a pressure F applied in such a direction as indicated by arrows through the flat plate 86.

Figure 9:
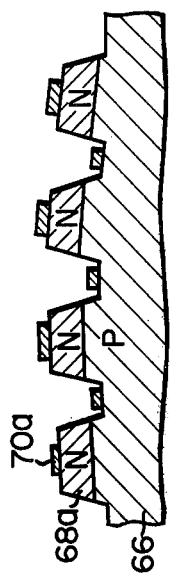
FIG. 9 is an overdrawn sectional view of a part of the device of FIG. 3.
Figure 8:
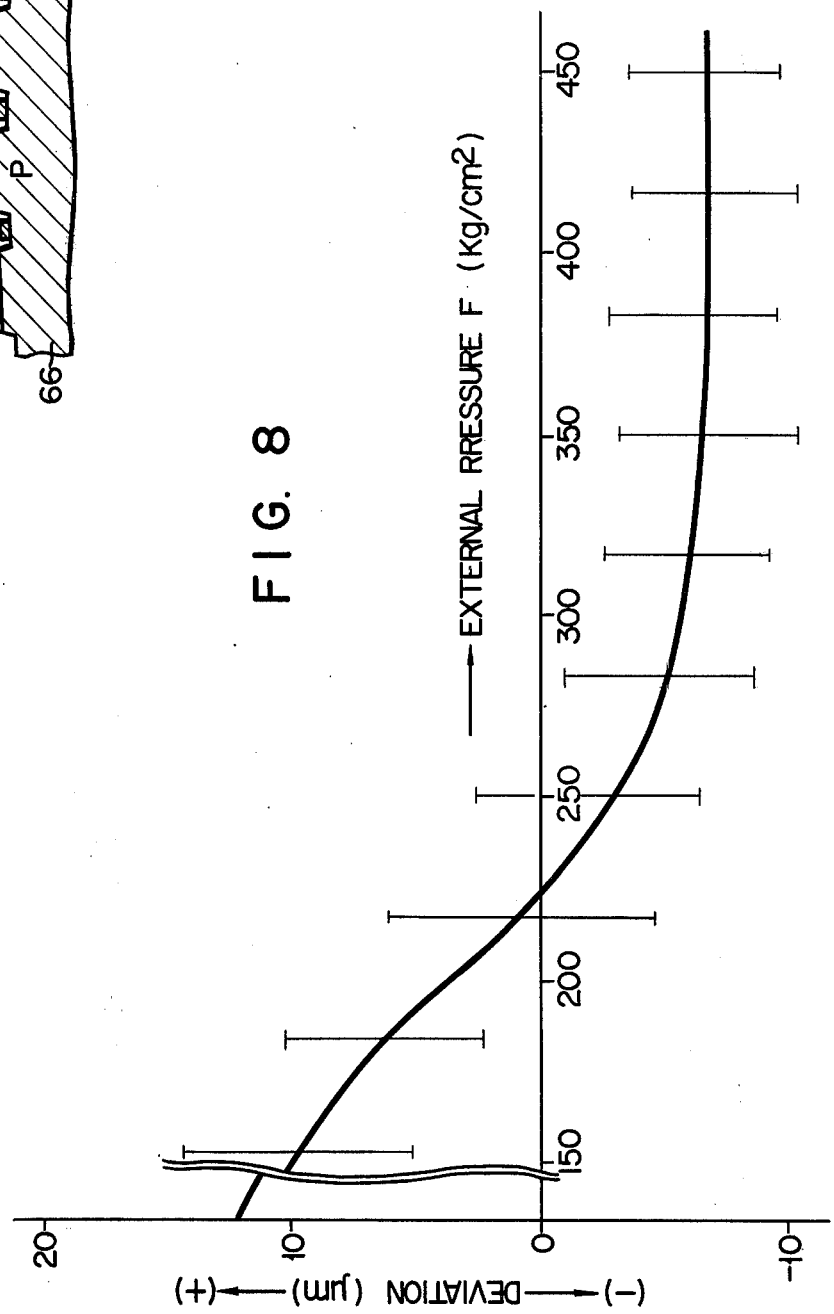
FIG. 8 is a characteristic curve illustrative of the relation between the external pressure F and the maximum deviation of the configuration curved thereby.

Thereupon, the device is so transformed that the central portion subsides downward as shown in FIG. 7. That is, the overall configuration becomes concave on the upper side. In this case, the cathode electrodes 70a, 70b, 70c and 70d are subjected to an external pressure by means of the flat plate 86 having the distance fully covering these electrodes, that is, from the outer edge of one outermost cathode electrode 70a to the outer edge of the other outermost cathode electrode 70d, the cathode layer portions 68a and 68d subside to the same degree with the cathode layer portions 68b and 68c without any deformation. Therefore, the surfaces of all the cathode electrodes 70a to 70d form the same level. Although in FIG. 7 each cathode electrode is shown to be disposed only on the central surface of its corresponding cathode layer portion, it in fact covers substantially the whole surface of the cathode layer portion. The external pressure F to be applied at this time must be at least higher than the pressure to which the device is subjected in use (the reason for this will be mentioned hereinafter). Usually, the solder is 100 to 200 $\mu$m thick, while the external pressure F should preferably be 300 to 450 kg/cm$^2$. This may be clear from the curve of FIG. 8 showing the relation between the external pressure F (kg/cm$^2$) and the deviation ($\mu$m) in surface level of cathode electrodes of the GTO. The characteristic as shown in FIG. 8 is determined for a GTO with the solder thickness of 100 to 200 $\mu$m, and the thin vertical lines show the deviations in surface level of cathode electrodes of GTO's. The deviation is defined to be at zero when the cathode electrodes 70a to 70d are in line with one another. As may be apparent from the characteristic curve of FIG. 8, the GTO element is in fact convex on the upper side (positive (+) side in FIG. 8) as shown in FIG. 9 before the external pressure F is applied. In FIG. 9 such state of deviation is more or less overdrawn. The GTO element employed in this experiment is convex to a degree of approximately 13 $\mu$m when it is subjected to no external pressure, though it reaches the substantially zero level when subjected to an external pressure of approximately 225 kg/cm$^2$. When the pressure F is applied to the GTO element, it is rendered sunken or concave (negative (−) side in FIG. 8). If subjected to the external pressure F of 300 kg/cm$^2$ or higher, the GTO element will be brought to substantial saturation. Therefore, the external pressure F applied at manufacture is required to be at least higher than 300 kg/cm$^2$, preferably 350 kg/cm$^2$ or higher.

Meanwhile, the GTO device is used with the external pressure applied thereto in order to reduce the thermal resistance. When the external pressure reach a fixed level, the thermal resistance will hardly change if the external pressure is further increased. In the case of a GTO device with the solder thickness of approximately 100 to 200 $\mu$m, the external pressure at which the thermal resistance is settled is 300 kg/cm$^2$ or higher, and the thermal resistance will hardly change if the external pressure is increased to 450 kg/cm$^2$ or higher. Accordingly, the external pressure to be applied at manufacture should preferably range from 350 to 450 kg/cm$^2$.

Incidentally, the suitable level of the external pressure F applied depends mainly on the thickness of the solder 82.

Figure 10:
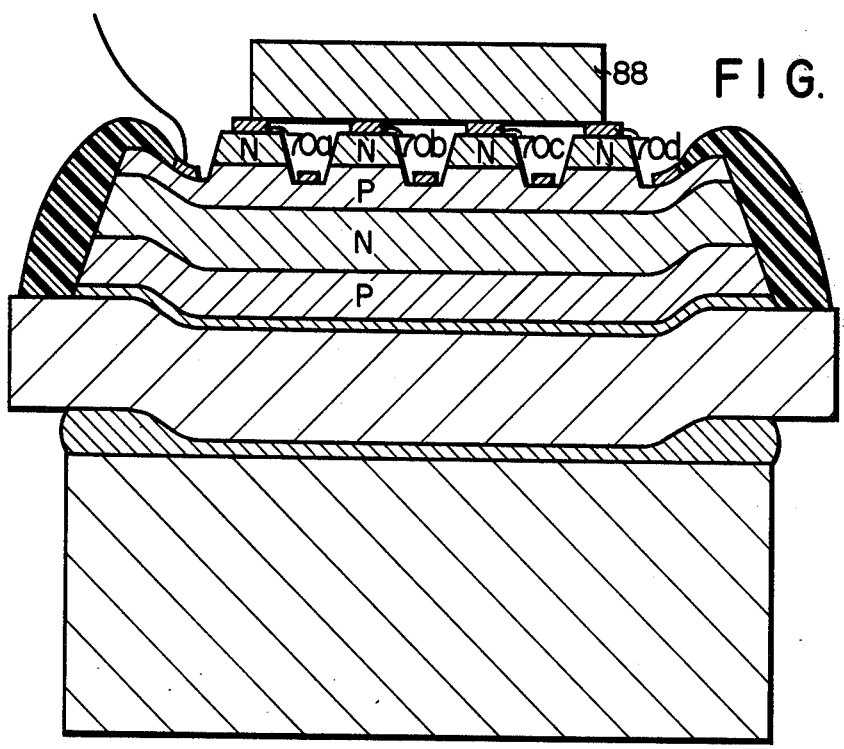

Subsequently, the flat plate 86 is removed, and a pressing plate 88 is disposed on the cathode electrodes 70a to 70d as shown in FIG. 10. This pressing plate 88 has no such lateral width that fully covers all the cathode electrodes 70a to 70d. That is, the lateral width of the pressing plate 88 is smaller than a distance covering from the outer edge of the cathode electrode 70a to the outer edge of the cathode electrode 70d. Therefore, the cathode electrodes 70a and 70d in contact with the edge portion of the pressing plate 88 are only partially covered with the plate 88.

Figure 11:
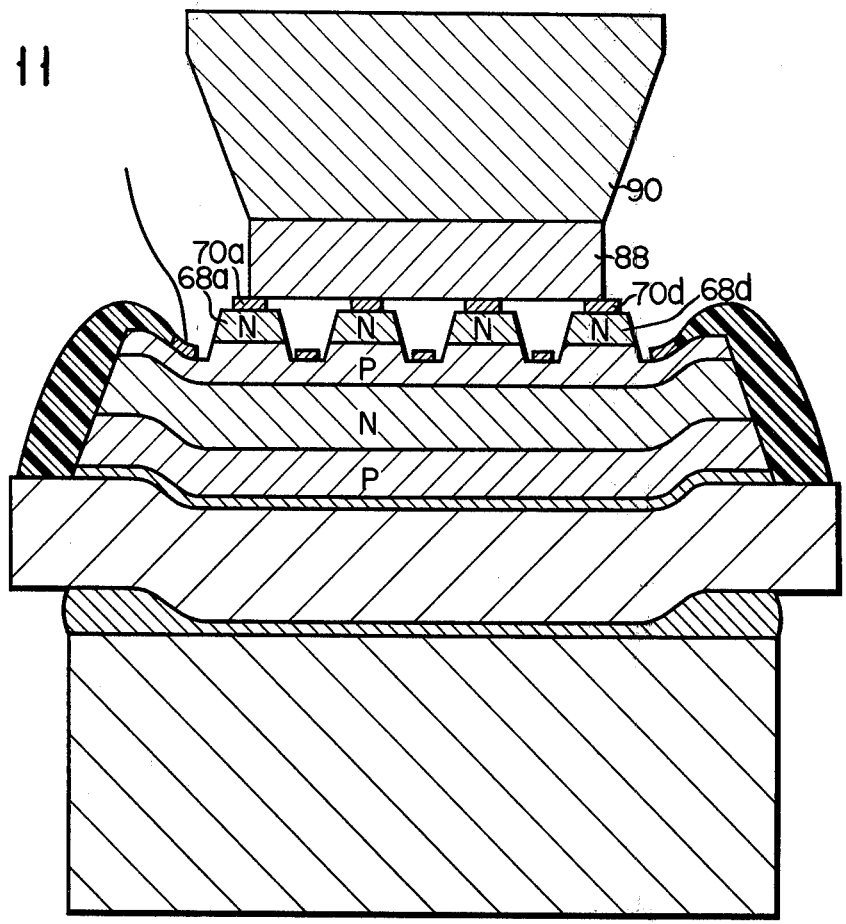

Then, as shown in FIG. 11, a cathode terminal plate 90 is disposed on the pressing plate 88.

When the above steps are completed, the manufacturing method of this invention is accomplished. There will now be described the reason why the pressure F applied to the GTO device at manufacture should be higher than the pressure applied to the device in use.

The reason is that if the pressure applied in use is made higher than the pressure applied at manufacture, then the cathode layer portions 68a and 68d will possibly be deformed. That is to say, the lateral width of the pressing plate 88 is not so large as fully to cover all the cathode electrodes 70a to 70d, covering both outermost cathode electrodes 70a and 70d only partially. Namely, the cathode electrodes 70a and 70d are brought in contact with the edge portion of the pressing plate 88. Thus, if there in use is applied a pressure higher than the pressure F applied at manufacture, the cathode layer portions 70a and 70d may be plastically deformed as stated before.

In the embodiment as described above, the solder 82 is plastically transformed without causing any deformation of the cathode layer portions 68a and 68d in contact with the edge portion of the pressing plate 88 by applying to the device an external pressure higher than the external pressure applied in use by means of the flat plate 86 with the lateral width larger than the distance covering all the cathode electrodes 70a to 70d before disposing the pressing plate 88, so that the cathode layer portions 68a and 68d will never be deformed even if the external pressure is applied by means of the cathode terminal plate 90 and pressing plate 88 in use. Accordingly, there will be eliminated the possibility of the increase in the current density of the cathode electrodes 70a and 70d which will lead to breakage of the element as well as the possibility of short-circuit between the cathode electrodes 70a and 70d and the gate electrode 74.

Figure 12:
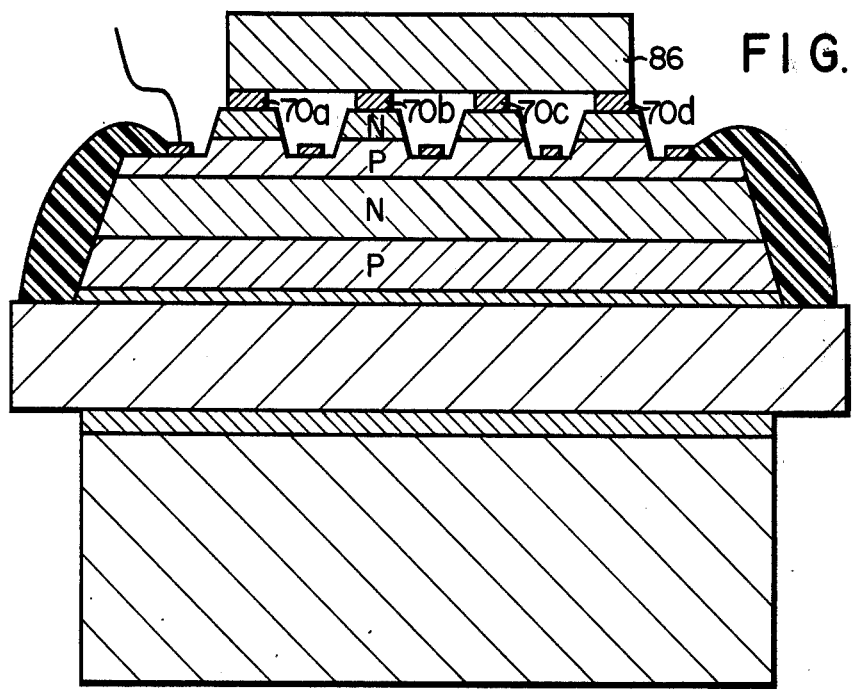
FIG. 12 is a sectional view showing another embodiment of the invention.

In FIG. 12, which corresponds to FIG. 6, the lateral width of the flat plate 86 of FIG. 7 is equal to the distance covering all the cathode electrodes. It is to be understood that there will be obtained in this case the same effect as in the case of the above-mentioned embodiment.

Although these two embodiments of this invention have been described in connection with the GTO device, it is to be understood that the invention is not limited to those precise embodiments, and that it may also be applied to the common thyristors, transistors, diodes or the like employed in the pressure-applied manner. Although the flat plate used in these embodiments is formed of metal, insulator or semiconductor flat plates may also be used. In this case, however, the members used should preferably be such ones that will be neither broken nor cracked by application of pressure.

What we claim is:

1. A method for manufacturing a mesa type semiconductor device which is used under pressure applied between an anode terminal plate and a cathode terminal plate and which includes a semiconductor body having an outer layer divided into a plurality of outer portions, the method comprising steps of: preparing a semiconductor body having two outer layers one of which is divided into a plurality of outer layer portions, each of said outer layer portions being provided with a first electrode and the other outer layer being provided with a second electrode; providing a support plate for the resultant structure in such a manner that said second electrode comes in contact with one surface of said support plate; mounting a first terminal plate on the other surface of said support plate by means of solder means; disposing on said first electrodes a flat plate having a lateral width covering at least from the outer edge of one outermost first electrode to the outer edge of the other outermost first electrode; applying a pressure from outside on to said semiconductor body through said flat plate; removing said flat plate; disposing on the first electrodes a pressing plate having a lateral width smaller than a distance ranging from the outer edge of said one outermost first electrode to the outer edge of said other outermost first electrode; and disposing a second terminal plate on the pressing plate.

2. A method according to claim 1 wherein said flat plate has a lateral width equal to a distance from the outer edge of said one outermost first electrode to the outer edge of said other outermost first electrode.

3. A method according to claim 1 wherein said first flat plate has a lateral width larger than said distance from the outer edge of said one outermost first electrode to the outer edge of said other outermost first electrode.

4. A method according to claim 1 wherein said pressure to be applied on to said semiconductor body is more than 300 kg/cm$^2$.

5. A method according to claim 4 wherein said pressure ranges from 350 to 450 kg/cm$^2$.

* * * * *

UNITED STATES PATENT AND TRADEMARK OFFICE
CERTIFICATE OF CORRECTION

PATENT NO. : 4,156,963
DATED : June 5, 1979
INVENTOR(S) : Isamu Tsuji and Nobuo Itazu It is certified that error appears in the above–identified patent and that said Letters Patent are hereby corrected as shown below:

Column 1, line 49, change "μmm" to --μm--.

Column 1, line 52, change "under surface" to --undersurface--.

Signed and Sealed this

Thirteenth Day of November 1979

[SEAL]

Attest:

RUTH C. MASON
Attesting Officer

LUTRELLE F. PARKER
Acting Commissioner of Patents and Trademarks